United States Patent
Jung et al.

(10) Patent No.: US 8,044,683 B2
(45) Date of Patent: Oct. 25, 2011

(54) LOGIC CIRCUIT CAPABLE OF LEVEL SHIFTING

(75) Inventors: Jonghoon Jung, Seoul (KR);
Sounghoon Sim, Yongin-si (KR); Mi yeon Ahn, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/660,544

(22) Filed: Mar. 1, 2010

(65) Prior Publication Data

US 2010/0231259 A1 Sep. 16, 2010

(30) Foreign Application Priority Data

Mar. 16, 2009 (KR) ........................ 10-2009-0022315

(51) Int. Cl.
*H03K 19/0175* (2006.01)
(52) U.S. Cl. .......................................... 326/81; 326/68
(58) Field of Classification Search ............... 326/68, 326/80–83, 104, 112; 327/333
See application file for complete search history.

(56) References Cited

U.S. PATENT DOCUMENTS

| 6,163,179 | A | * | 12/2000 | Huang et al. | .................. 327/108 |
| 6,664,943 | B1 | | 12/2003 | Nakajima et al. | |
| 7,548,093 | B1 | * | 6/2009 | Priel et al. | ........................ 326/63 |
| 2006/0139059 | A1 | | 6/2006 | Jeong | |
| 2008/0224972 | A1 | | 9/2008 | Nakajima et al. | |

FOREIGN PATENT DOCUMENTS

| JP | 2003-143004 A | 5/2003 |
| KR | 10-2006-0073804 A | 6/2006 |
| KR | 10-2006-0105701 A | 10/2006 |
| KR | 10-2007-0076112 A | 7/2007 |

* cited by examiner

*Primary Examiner* — James H Cho
(74) *Attorney, Agent, or Firm* — Onello & Mello, LLP

(57) ABSTRACT

A logic circuit includes a logic gate unit, an inverter, and a switching circuit. The logic gate unit receives a power supply voltage and an input signal to output a first signal. The inverter receives the first signal to output a second signal. The switching circuit provides one of first and second power supply voltages as the power supply voltage of the logic gate unit in response to the first and second signals. The first power supply voltage and the second power supply voltage have different voltage levels, thus enabling stable level shifting.

14 Claims, 3 Drawing Sheets

LOGIC CIRCUIT CAPABLE OF LEVEL SHIFTING

CROSS-REFERENCE TO RELATED APPLICATIONS

This U.S. non-provisional patent application claims priority under 35 U.S.C. §119 of Korean Patent Application No. 10-2009-0022315, filed in the Korean Intellectual Property Office on Mar. 16, 2009, the entire contents of which are hereby incorporated by reference.

BACKGROUND

The present inventive concept described herein relates to semiconductor design technology, and more particularly, to logic circuits capable of level shifting.

The voltage levels of power supply voltages applied from external devices are decreasing with the trend toward a decrease in the power consumption of semiconductor memory devices. A circuit for shifting an external low-level power supply voltage to a high-level power supply voltage is required to secure the operational stability and driving force of an internal device. Such a circuit is called a level shifter.

Recently, a continuing effort is being made to provide high integration and miniaturization in the semiconductor technology. However, using a level shifter to connect two logic units operating at different voltage levels may increase the occupied circuit area. It is desirable to provide a level shifting capability while minimizing an increase in the circuit occupation area.

SUMMARY

Embodiments of the inventive concept provide logic circuits capable of level shifting.

According to one aspect, the inventive concept is directed to a logic circuit including: a logic gate unit receiving a power supply voltage and an input signal to output a first signal; an inverter receiving the first signal to output a second signal; and a switching circuit providing one of first and second power supply voltages as the power supply voltage of the logic gate unit in response to the first and second signals. The first power supply voltage and the second power supply voltage have different voltage levels.

In some embodiments, the logic gate unit includes at least one CMOS logic gate.

In some embodiments, the logic gate unit includes a combination of logic gates.

In some embodiments, the first power supply voltage has a lower voltage level than the second power supply voltage.

According to another aspect, the inventive concept is directed to a logic circuit including: a logic gate unit receiving a power supply voltage and an input signal to output a first signal; an inverter receiving the first signal to output a second signal; a first switching circuit providing a first power supply voltage as the power supply voltage of the logic gate unit in response to the second signal; and a second switching circuit providing a second power supply voltage as the power supply voltage of the logic gate unit in response to the first signal. The first power supply voltage and the second power supply voltage have different voltage levels.

In some embodiments, the first switching circuit is connected between the first power supply voltage and the power input terminal of the logic gate unit and includes a first transistor controlled by the second signal.

In some embodiments, the second switching circuit is connected between the second power supply voltage and the power input terminal of the logic gate unit and includes a second transistor controlled by the first signal.

In some embodiments, the first and second transistors are PMOS transistors.

In some embodiments, the logic gate unit includes a combination of logic gates.

In some embodiments, the first power supply voltage has a lower voltage level than the second power supply voltage.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept.

DETAILED DESCRIPTION OF THE EMBODIMENTS

Preferred embodiments of the inventive concept will be described below in more detail with reference to the accompanying drawings. The inventive concept may, however, be embodied in different forms and should not be construed as limited to the embodiments set forth herein. Rather, these embodiments are provided so that this description will be thorough and complete, and will fully convey the scope of the inventive concept to those skilled in the art.

Hereinafter, exemplary embodiments of the inventive concept will be described in detail with reference to the accompanying drawings.

Figure 1:
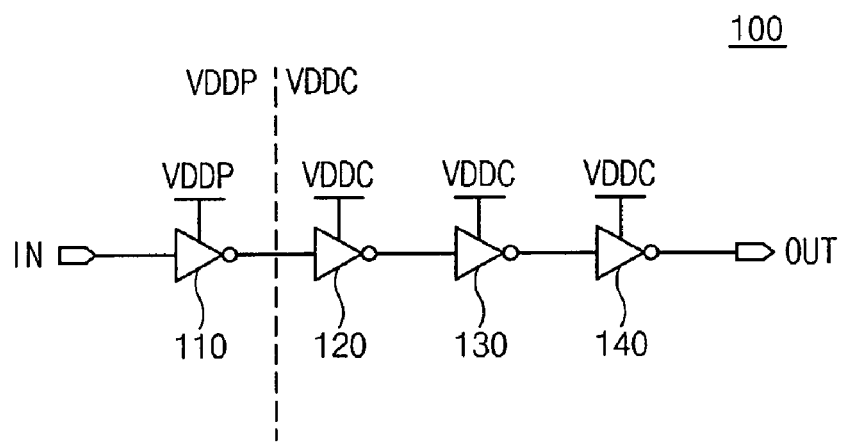
FIG. 1 is a diagram illustrating a typical buffer including a plurality of inverters.

FIG. 1 is a diagram illustrating a typical buffer including a plurality of inverters.

Referring to FIG. 1, inverters 110~140 are sequentially connected in series. The first inverter 110 receiving an input signal IN receives a first power supply voltage VDDP, and the other inverters 120~140 receive a second power supply voltage VDDC. The inverter 120 receives a signal corresponding to the first power supply voltage VDDP to output a signal corresponding to the second power supply voltage VDDC, thus performing a level shifting operation. For example, if the inverter 120 includes a PMOS transistor (not illustrated) and an NMOS transistor (not illustrated), an operation of the buffer including the inverters 110~140 can be stably performed when the first power supply voltage VDDP has a higher level than the second power supply voltage VDDC. However, when the first power supply voltage VDDP has a lower level than the second power supply voltage VDDC, a current path is created through the MOS transistors of the inverter 120 to increase the amount of leakage current, thus outputting an undesired output signal OUT.

Figure 2:
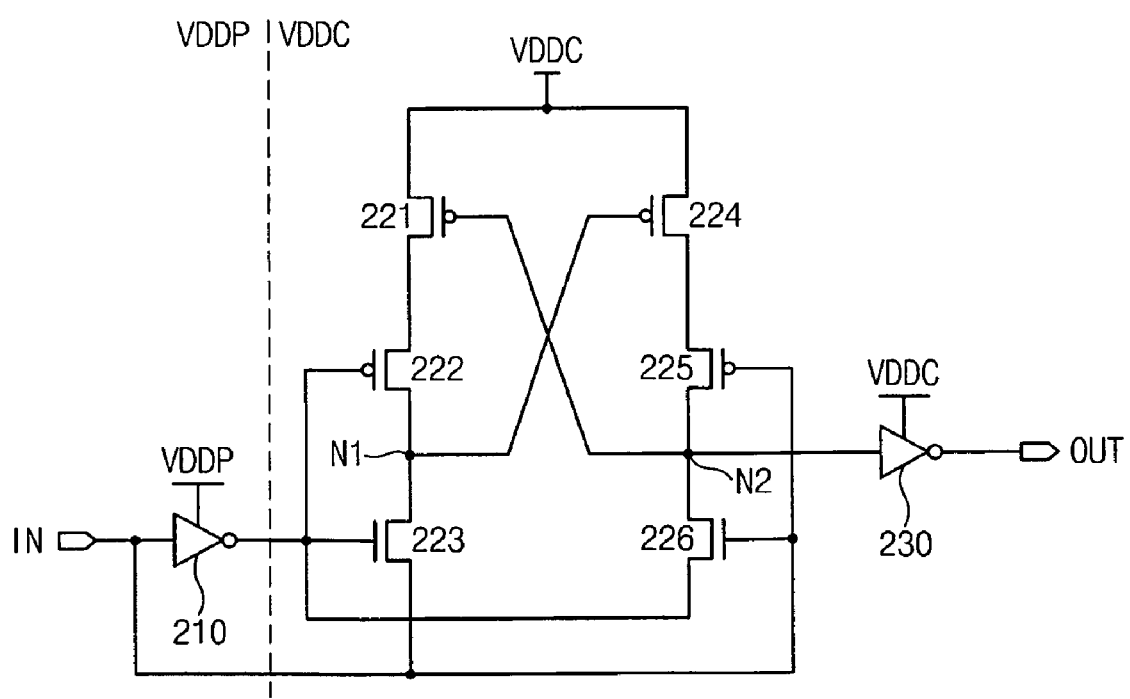
FIG. 2 is a diagram illustrating an example of a typical level shifter.

FIG. 2 is a diagram illustrating an example of a typical level shifter.

Referring to FIG. 2, the level shifter includes inverters 210 and 230, PMOS transistors 221, 222, 224 and 225, and NMOS transistors 223 and 226. The inverter 210 inverts an input signal IN. The inverter 210 receives a first power supply voltage VDDP. The NMOS transistor 223 is connected between a node N1 and the input signal IN and has a gate controlled by the output of the inverter 210. The NMOS transistor 226 is connected between a node N2 and the output terminal of the inverter 210 and has a gate controlled by the input signal IN.

The PMOS transistors 221 and 222 are sequentially connected in series between a second power supply voltage VDDC and the node N1. The PMOS transistor 221 has a gate connected to the node N2 that connects the PMOS transistor 225 and the NMOS transistor 226. The PMOS transistor 222 has a gate connected to the output terminal of the inverter 210. The PMOS transistors 224 and 225 are sequentially connected in series between the second power supply voltage VDDC and the node N2. The PMOS transistor 224 has a gate connected to the node N1 that connects the PMOS transistor 222 and the NMOS transistor 223. The PMOS transistor 225 has a gate connected to the input signal IN. The inverter 230 receives the second power supply voltage VDDC and inverts a signal of the node N2 to output an output signal OUT.

In the level shifter, when the input signal IN has a high level, the NMOS transistor 226 is turned on to discharge the node N2, thus turning on the PMOS transistor 225. The PMOS transistor 222 is turned on in response to the low-level signal outputted from the inverter 210. Thus, the node N1 has a high level. Thus, the PMOS transistor 224 is turned off and the output signal OUT has a high level.

On the other hand, when the input signal IN has a low level, the NMOS transistor 223 is turned on to discharge the node N1, thus turning on the PMOS transistor 224. The PMOS transistor 225 is turned on in response to the low-level input signal IN. Thus, the second power supply voltage VDDC is applied through the PMOS transistors 224 and 225 to the node N2. Thus, the output signal OUT has a low level.

The level shifter of FIG. 2 can output the stable output signal OUT even when the first power supply voltage VDDP has a lower level than the second power supply voltage VDDC. Also, the level shifter of FIG. 2 does not greatly increase the circuit occupation area because it can perform a level shifting operation by replacing the inverters 120 and 130 of FIG. 1 by the transistors 221~226.

However, if a level shifter, instead of an inverter buffer, is additionally included in a combinational logic unit including a combination of various logic gates such as NAND gates, NOR gates, AND gates, OR gates, and inverters, it may cause an increase in the circuit occupation area, a decrease in the operation speed, and an increase in the power consumption.

Figure 3:
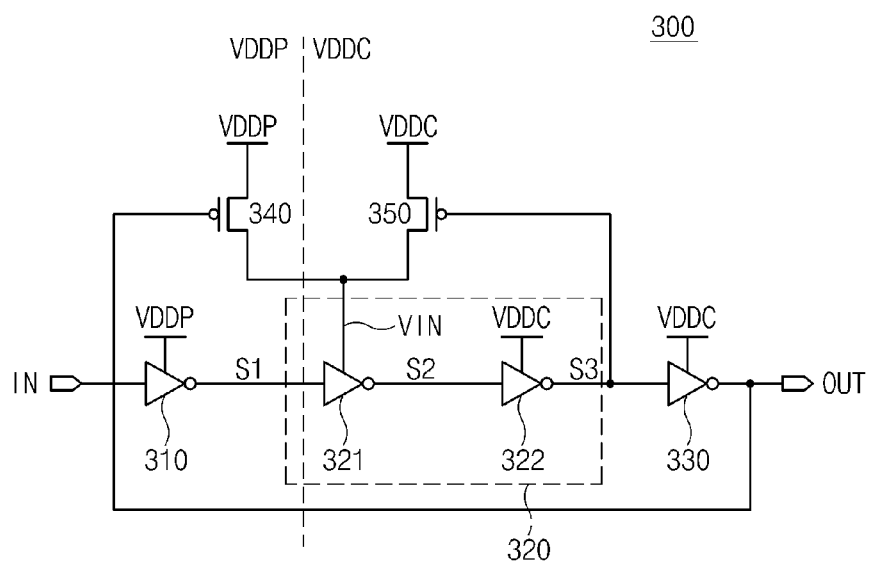
FIG. 3 is a diagram illustrating a logic circuit according to an exemplary embodiment of the inventive concept.

FIG. 3 is a diagram illustrating a logic circuit according to an exemplary embodiment of the inventive concept.

Referring to FIG. 3, a logic circuit 300 includes inverters 310 and 330, a logic gate unit 320, and PMOS transistors 340 and 350. In this embodiment, the logic gate unit 320 includes two logic gates, i.e., inverters 321 and 322. The logic gates are the minimum conceptual units constituting the logic circuit, examples of which include AND gates, OR gates, inverters, NAND gates, NOR gates, multiplexers, and demultiplexers. The logic gate unit 320 may include one or more logic gates.

The inverters 310, 321, 322 and 330 are sequentially connected in series between an input signal IN and an output signal OUT. The inverter 310 receives a first power supply voltage VDDP. The inverter 321 receives one of the first power supply voltage VDDP through the PMOS transistor 340 and a second power supply voltage VDDC through the PMOS transistor 350. The inverters 322 and 330 receive the second power supply voltage VDDC. In this embodiment, the first power supply voltage VDDP has a lower level than the second power supply voltage VDDC.

The PMOS transistor 340 is connected between the first power supply voltage VDDP and a power input terminal VIN of the inverter 321, and has a gate connected to the output signal of the inverter 330, i.e., the output signal OUT. The PMOS transistor 350 is connected between the second power supply voltage VDDC and the power input terminal VIN of the inverter 321, and has a gate connected to the output signal of the inverter 322.

Figure 4:
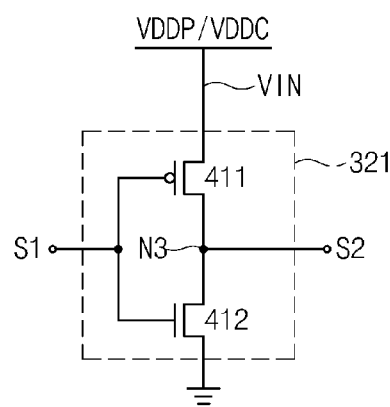
FIG. 4 is a diagram illustrating the configuration of an inverter of FIG. 3 according to an embodiment of the inventive concept.

FIG. 4 is a diagram illustrating the configuration of the inverter 321 of FIG. 3 according to an embodiment of the inventive concept.

Referring to FIG. 4, the inverter 321 includes a PMOS transistor 411 and an NMOS transistor 412 that are sequentially connected in series between a ground voltage and the power input terminal VIN receiving one of the first and second power supply voltages VDDP and VDDC. The PMOS transistor 411 and the NMOS transistor 412 have gates connected to a signal S1 outputted from the inverter 310. A signal S2 of a node N3 connecting the PMOS transistor 411 and the NMOS transistor 412 is provided to the inverter 322 of FIG. 3.

An operation of the logic circuit 300 will be described below with reference to FIGS. 3 and 4.

First, when the input signal IN has a low level, the inverter 310 outputs a high-level signal S1. The NMOS transistor 412 of the inverter 321 is turned on in response to the high-level signal S1 to discharge the node N3 to the ground voltage. A low-level signal S2 of the node N3 is transferred to the inverter 322. The inverter 322 outputs a high-level signal S3 in response to the low-level signal S2, and the inverter 330 outputs a low-level output signal OUT. The PMOS transistor 340 is turned on in response to the low-level output signal OUT, and the inverter 321 receives the first power supply voltage VDDP. In this case, the PMOS transistor 350 is turned off because the signal S3 has a high level.

When the input signal IN shifts to a high level, the output signal S1 of the inverter 310 shifts to a low level and the PMOS transistor 411 of the inverter 321 is turned on to shift the signal S2 to a high level. When the signal S2 shifts to a high level, the inverter 322 outputs a low-level signal S3 and the inverter 330 outputs a high-level signal OUT. Thus, the PMOS transistor 350 is turned on and the PMOS transistor 340 is turned off. Thus, the inverter 321 receives the second power supply voltage VDDC.

When the input signal IN shifts from the high level to the low level, the output signal S1 of the inverter 310 shifts to a high level. The NMOS transistor 412 of the inverter 321 is turned on in response to the high-level signal S1 to shift the signal S2 to a low level. The output signal S3 of the inverter 322 shifts to a high level, and the output signal OUT of the inverter 330 shifts to a low level. Thus, the PMOS transistor 350 is turned off and the PMOS transistor 340 is turned on. Thus, the inverter 321 receives the first power supply voltage VDDP.

In this manner, the logic circuit 300 can perform a stable level shifting operation by further including only two switching transistors 340 and 350 that receive different power supply voltages.

Figure 5:
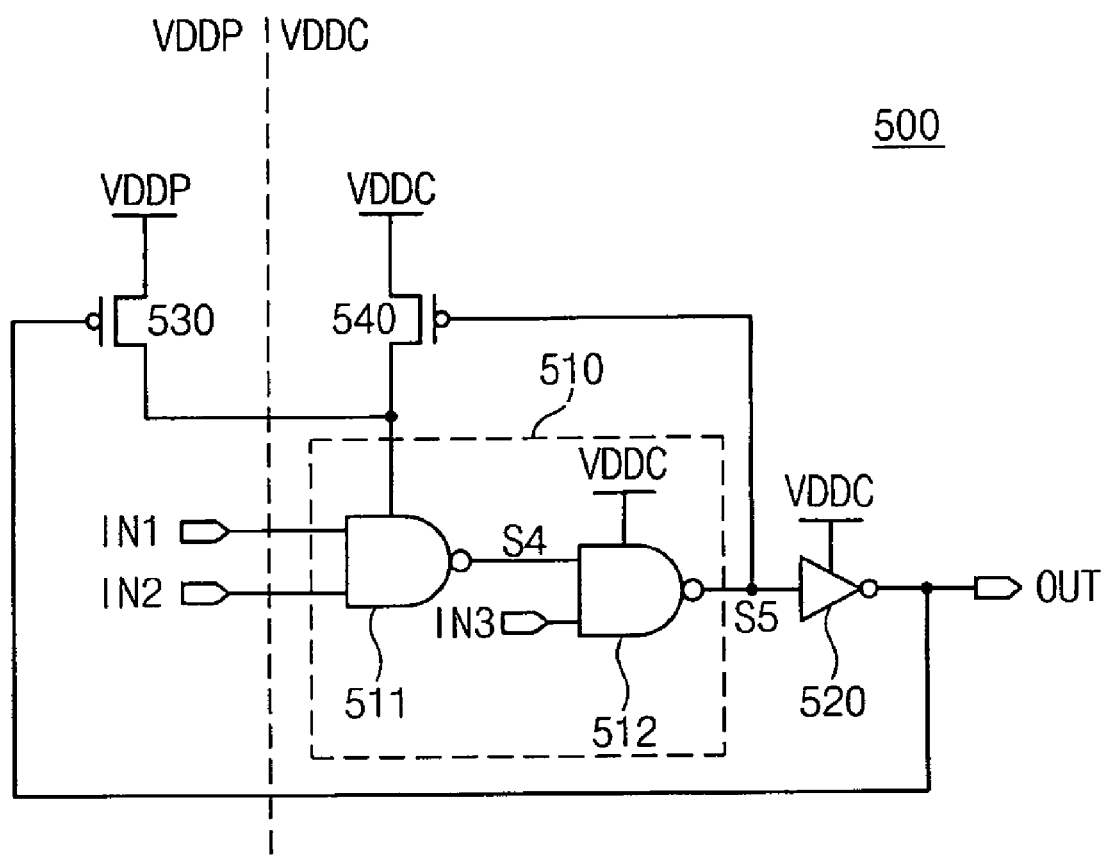
FIG. 5 is a diagram illustrating a logic circuit according to another exemplary embodiment of the inventive concept.

FIG. 5 is a diagram illustrating a logic circuit according to another exemplary embodiment of the inventive concept.

Referring to FIG. 5, a logic circuit 500 includes a logic gate unit 510, an inverter 520, and PMOS transistors 530 and 540. The logic gate unit 510 further includes two NAND gates 511 and 512. The NAND gate 511 receives input signals IN1 and IN2 to output a signal S4. The NAND gate 512 receives an input signal IN3 and the output signal S4 of the NAND gate 511 to output a signal S5. The output signal S5 of the NAND gate 512 is inputted to a gate of the PMOS transistor 540, and an output signal OUT of the inverter 520 is inputted to a gate of the PMOS transistor 530.

The PMOS transistor 530 provides the first power supply voltage VDDP to the NAND gate 511 in response to the output signal OUT of the inverter 520. The PMOS transistor 540 provides the second power supply voltage VDDC to the NAND gate 511 in response to the output signal S5 of the NAND gate 512.

As illustrated in FIG. 5, the logic circuit 500 includes the inverter 520 and the PMOS transistors 530 and 540 that are connected to the logic gate unit 510 to perform a level shifting operation for the power supply voltage in the logic gate unit 510. In this manner, a level shifting operation in the logic gate unit 510 can be performed by adding a simple circuit structure.

As described above, the use of the inventive concept makes it possible to implement a logic circuit that is capable of level shifting with simplified circuit structure.

The above-disclosed subject matter is to be considered illustrative and not restrictive, and the appended claims are intended to cover all modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A logic circuit comprising:
a logic gate unit receiving a power supply voltage and an input signal to output a first signal;
an inverter receiving the first signal to output a second signal; and
a switching circuit providing one of first and second power supply voltages to a power input terminal of the logic gate unit in response to the first and second signals, wherein a first transistor of the switching circuit directly receives the first signal and a second transistor of the switching circuit receives the second signal,
wherein the power input terminal of the logic gate unit comprises one of a source and a drain terminal of a transistor of the logic gate unit, and
wherein the first power supply voltage and the second power supply voltage have different voltage levels.

2. The logic circuit of claim 1, wherein the logic gate unit comprises at least one CMOS logic gate.

3. The logic circuit of claim 1, wherein the logic gate unit comprises a combination of logic gates.

4. The logic circuit of claim 1, wherein the first power supply voltage has a lower voltage level than the second power supply voltage.

5. The logic circuit of claim 1, wherein the switching circuit comprises a first transistor connected between the first power supply voltage and the power input terminal of the logic gate unit, and has a gate terminal connected to an output of the inverter, and a second transistor connected between the second power supply voltage and the power input terminal of the logic gate unit, and has a gate terminal connected to an output of the logic gate unit.

6. The logic circuit of claim 1, wherein the first transistor of the switching circuit provides the first power supply voltage to the power input terminal of the logic gate unit in response to the second signal.

7. The logic circuit of claim 6, wherein the second transistor of the switching circuit provides the second power supply voltage to the power input terminal of the logic gate unit in response to the first signal.

8. A logic circuit comprising:
a first inverter receiving an input signal at a first input terminal, the first inverter outputting a first signal;
a logic gate unit receiving a power supply voltage and the first signal to output a second signal;
a second inverter receiving the second signal to output a third signal;
a first switching circuit receiving the third signal and providing a first power supply voltage as the power supply voltage of the logic gate unit in response to the third signal; and
a second switching circuit directly receiving the second signal and providing a second power supply voltage as the power supply voltage of the logic gate unit in response to the second signal,
wherein the first power supply voltage and the second power supply voltage have different voltage levels.

9. The logic circuit of claim 8, wherein the first switching circuit is connected between the first power supply voltage and the power input terminal of the logic gate unit and includes a first transistor having a gate terminal that receives the third signal.

10. The logic circuit of claim 9, wherein the second switching circuit is connected between the second power supply voltage and the power input terminal of the logic gate unit and includes a second transistor having a gate terminal that receives the second signal.

11. The logic circuit of claim 10, wherein the first and second transistors are PMOS transistors.

12. The logic circuit of claim 8, wherein the logic gate unit comprises a combination of logic gates.

13. The logic circuit of claim 8, wherein the first power supply voltage has a lower voltage level than the second power supply voltage.

14. The logic circuit of claim 8, wherein the power input terminal of the logic gate unit comprises one of a source and drain terminal of a transistor of the logic gate unit.

* * * * *